(12) United States Patent
Willey et al.

(10) Patent No.: US 11,996,848 B1
(45) Date of Patent: May 28, 2024

(54) COMPENSATION FOR CLOCK FREQUENCY MODULATION

(71) Applicant: Advanced Micro Devices, Inc., Santa Clara, CA (US)

(72) Inventors: Aaron D. Willey, Santa Clara, CA (US); Karthik Gopalakrishnan, Santa Clara, CA (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 17/979,622

(22) Filed: Nov. 2, 2022

(51) Int. Cl.
  *H03K 5/135* (2006.01)
  *H03K 5/14* (2014.01)
  *H03K 7/06* (2006.01)

(52) U.S. Cl.
  CPC ............... *H03K 5/135* (2013.01); *H03K 5/14* (2013.01); *H03K 7/06* (2013.01)

(58) Field of Classification Search
  None
  See application file for complete search history.

(56) References Cited

U.S. PATENT DOCUMENTS 10,863,919 B2 * 12/2020 Xue ..................... G01R 33/543

* cited by examiner

*Primary Examiner* — Cassandra F Cox
(74) *Attorney, Agent, or Firm* — Greenberg Traurig, LLP (57) ABSTRACT

The disclosed computer-implemented method includes providing, by a reference clock circuit, a clock signal for a clock-triggered element triggered by the clock signal and modulating, by a frequency modulation circuit, a frequency of the clock signal. The method also includes inserting, by a phase compensation circuit, a phase compensation offset to the modulated clock signal in a manner that compensates for a phase error produced by modulating the frequency of the clock signal. Various other methods, systems, and computer-readable media are also disclosed.

20 Claims, 7 Drawing Sheets

COMPENSATION FOR CLOCK FREQUENCY MODULATION

BACKGROUND

Memory devices, graphics systems, and other systems-on-chips (SoCs) often use clock signals for sending data signals, which may result in bursts of energy that create electromagnetic interference (EMI). To reduce the peak energy and EMI, Spread Spectrum Clocking (SSC) techniques can modulate a system's clock frequency to spread signaling energy over a frequency range. For example, the system's clock frequency can be modulated by reducing the frequency.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

As will be described in greater detail below, the instant disclosure describes various systems and methods for compensation for clock frequency modulation. As will be explained in greater detail below, implementations of the present disclosure including modulating a frequency of a clock signal and inserting a phase compensation offset to the modulated clock signal in a manner that compensates for a phase error produced by modulating the frequency of the clock signal. The phase compensation offset can compensate for phase errors, jitter, and other undesired effects of clock frequency modulation.

In one example, a method for compensation for clock frequency modulation includes providing, by a reference clock circuit, a clock signal for a clock-triggered element triggered by the clock signal and modulating, by a frequency modulation circuit, a frequency of the clock signal. The method also includes inserting, by a phase compensation circuit, a phase compensation offset to the modulated clock signal in a manner that compensates for a phase error produced by modulating the frequency of the clock signal.

In some examples, the method includes determining, by the phase compensation circuit, the phase compensation offset based on a modulation value provided by the frequency modulation circuit. In some examples, the method includes determining, by the phase compensation circuit, the phase compensation offset by inferring a modulation value for the frequency modulation. In some examples, inferring the modulation value is based on observing phase changes of the clock signal in the system. In some examples, observing the phase changes includes at least one of comparing a return clock signal with the clock signal or determining a delay delta beyond an expected phase delay due to a temperature change.

In one example, a system for compensation for clock frequency modulation includes a reference clock circuit configured to produce a clock signal and a frequency modulation circuit coupled to the reference clock circuit and configured to modulate a frequency of the clock signal. The system also includes a phase compensation circuit coupled to the reference clock circuit and configured to compensate for a phase error produced by modulating the frequency of the clock signal and a latch circuit coupled to the reference clock circuit and triggered by the clock signal.

In some examples, the phase compensation circuit compensates for the phase error by inserting a phase compensation offset to the modulated clock signal based on a modulation value provided by the frequency modulation circuit. In some examples, the phase compensation circuit incrementally adjusts the phase compensation in real time based on the modulation value.

In some examples, the phase compensation circuit compensates for the phase error by inserting a phase compensation offset into the modulated clock signal based on inferring a modulation value for the frequency modulation. In some examples, the phase compensation circuit infers the modulation value based on observing phase changes of the clock signal in the system. In some examples, the phase compensation circuit observes the phase changes by comparing a return clock signal with the clock signal. In some examples, the phase compensation circuit comprises a comparator for comparing the return clock signal with the clock signal. In some examples, the phase compensation circuit observes the phase changes by determining a delay delta beyond an expected phase delay due to a temperature change.

In some examples, the phase compensation circuit comprises a bandpass filter for filtering the modulated clock signal. In some examples, the phase compensation circuit comprises a feedback loop for modulating a magnitude and phase value of the clock signal. In some examples, the phase compensation circuit is coupled along an input path for the latch circuit. In some examples, the phase compensation circuit is coupled along a clock path for the clock signal.

In one example, a memory device for compensation for clock frequency modulation includes a reference clock circuit configured to produce a clock signal and a frequency modulation circuit coupled to the reference clock circuit and configured to modulate a frequency of the clock signal. The memory device also includes a phase compensation circuit coupled to the frequency modulation circuit and configured to compensate for a phase error produced by modulating the frequency of the clock signal and a data storage element coupled to the reference clock circuit and triggered by the clock signal.

In some examples, the phase compensation circuit is coupled along a data path for the data storage element. In some examples, the phase compensation circuit is coupled along a clock path for the clock signal.

Features from any of the above-mentioned implementations can be used in combination with one another in accordance with the general principles described herein. These and other implementations, features, and advantages will be more fully understood upon reading the following detailed description in conjunction with the accompanying drawings and claims.

The following will provide, with reference to FIGS. 1-7, detailed descriptions of systems and methods for compensation for clock frequency modulation. Detailed descriptions of example systems for compensation for clock frequency modulation will be provided in connection with FIG. 1. Detailed descriptions of an example memory device system will be provided in connection with FIG. 2. In addition, detailed descriptions of clock frequency modulation will be provided in connection with FIGS. 3, 4A, and 4B. Detailed descriptions of compensation for clock frequency modulation will further be provided in connection with FIGS. 5A, 5B, 6A, and 6B. Detailed descriptions of corresponding computer-implemented methods will also be provided in connection with FIG. 7.

Figure 1:
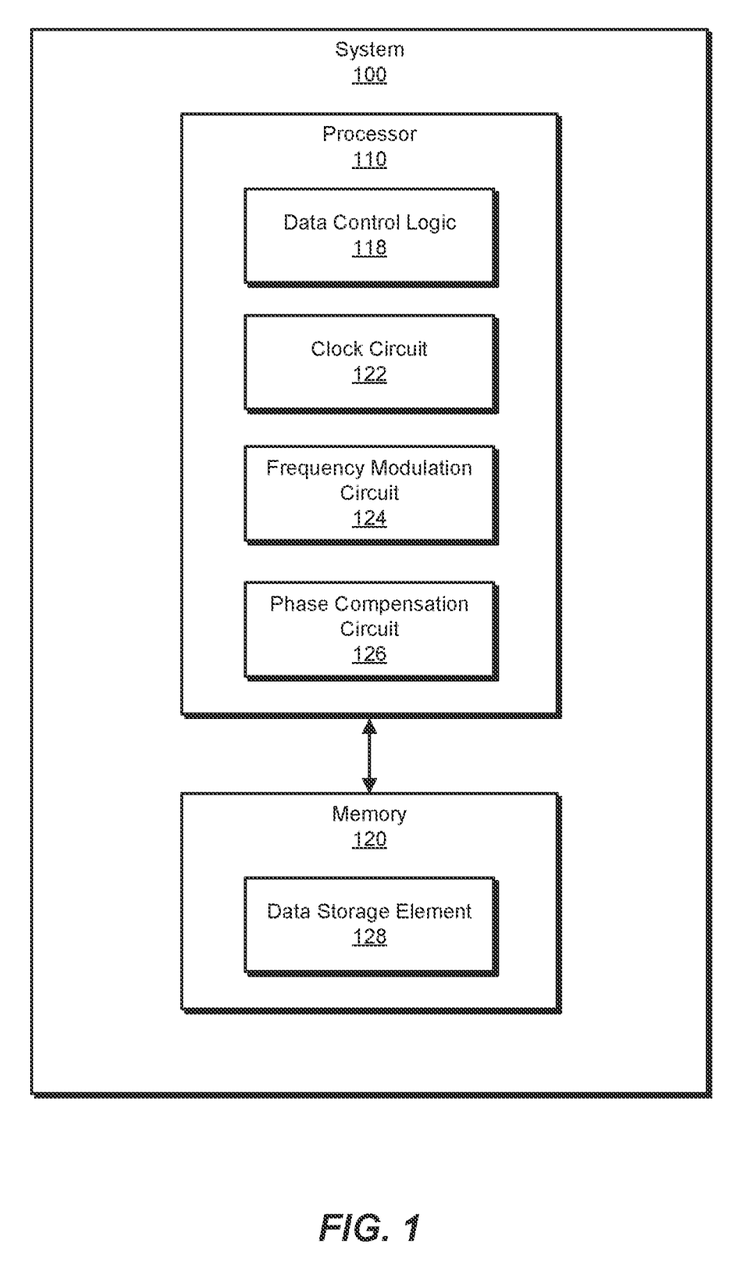
FIG. 1 is a block diagram of an exemplary system for compensating for clock frequency modulation.

FIG. 1 is a block diagram of an example system 100 for compensating for clock frequency modulation. System 100 corresponds to a computing device, such as a desktop computer, a laptop computer, a server, a tablet device, a mobile device, a smartphone, a wearable device, an augmented reality device, a virtual reality device, a network device, an electronic device, portions of one or more of the same, and/or variations or combinations of one or more of the same. As illustrated in FIG. 1, system 100 includes one or more memory devices, such as memory 120. Memory 120 generally represents any type or form of volatile or non-volatile storage device or medium capable of storing data and/or computer-readable instructions. Examples of memory 120 include, without limitation, Random Access Memory (RAM), Read Only Memory (ROM), flash memory, Hard Disk Drives (HDDs), Solid-State Drives (SSDs), optical disk drives, caches, variations or combinations of one or more of the same, and/or any other suitable storage memory. Memory 120 includes a data storage element 128, which can be a latch circuit, flip-flop, or other circuit for storing data. Data storage element 128 can be a clock-triggered element triggered by a clock signal.

As illustrated in FIG. 1, example system 100 includes one or more physical processors, such as processor 110. Processor 110 generally represents any type or form of hardware-implemented processing unit capable of interpreting and/or executing computer-readable instructions. In some examples, processor 110 accesses and/or modifies data and/or instructions stored in memory 120. Examples of processor 110 include, without limitation, microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor.

As further illustrated in FIG. 1, processor 110 includes a data control logic 118, a clock circuit 122, a frequency modulation circuit 124, and a phase compensation circuit 126. Data control logic 118 is a circuit for controlling data storage and in some examples is a bidirectional circuit (e.g., capable of sending and receiving data signals) and in some examples provides link training (e.g., phase alignment, voltage control, etc. for improving signal processing), serializing, and deserializing. Clock circuit 122 is a reference clock (e.g., an oscillator or other clock) for sending clock signals that can trigger clock-triggered elements such as data storage element 128. The clock signals can oscillate between high and low values at particular frequencies to activate clock-triggered elements based on rising and/or falling edges of the oscillating clock signal. In some examples, clock circuit 122 includes a distribution tree or circuits for propagating the clock signal. Frequency modulation circuit 124 is a circuit that modulates (e.g., increases and/or decreases) a frequency of the clock signal from clock circuit 122, as described further herein. Phase compensation circuit 126 is a circuit for inserting a phase compensation offset to the modulated clock signal as described herein.

Figure 2:
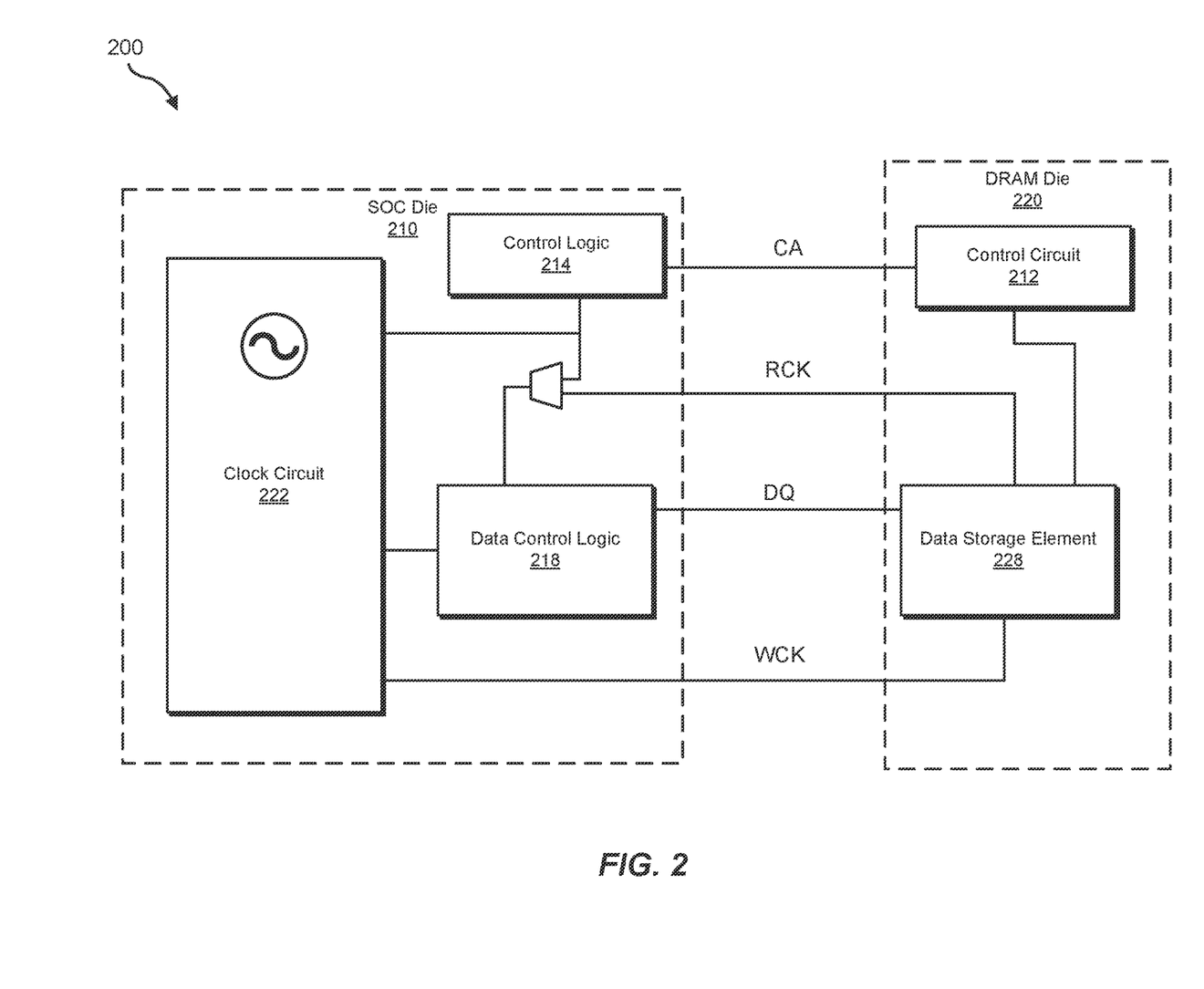
FIG. 2 is a block diagram of an exemplary memory device.

FIG. 2 illustrates a simplified example system 200 which corresponds to system 100. In some examples, system 200 can be a graphics processing system or hardware accelerator system. System 200 includes an SOC die 210 which corresponds to processor 110 and a DRAM die 220 (e.g., a Graphics Double Data Rate (GDDR) memory) which corresponds to memory 120.

SOC die 210 includes a clock circuit 222 which corresponds to clock circuit 122, a control logic 214, and a data control logic 218 which corresponds to data control logic 118. Control logic 214 includes circuits for serialization of data and in some examples is a unidirectional circuit (e.g., only sending signals to DRAM die 220 without receiving signals from DRAM die 220). DRAM die 220 includes a control circuit 212 and a data storage element 228 which corresponds to data storage element 128. Control circuit 212 includes circuits for controlling DRAM die 220, such as propagating/delaying clock signals (e.g., based on clock signal CA).

SOC die 210 holds data in data control logic 218 that can be read from and/or written to data storage element 228 along an input or data path (e.g., DQ). A timing of reads/writes may be triggered by a clock signal (e.g. along a rising or falling edge of an oscillating signal) from clock circuit 222. For example, WCK provides a toggling clock signal that establishes a cadence for sending data. RCK provides the clock signal returning to SOC die 210 from DRAM die 220. System 200 can use frequency modulation techniques for modulating a frequency of the clock signal, as will be described below.

Figure 3:
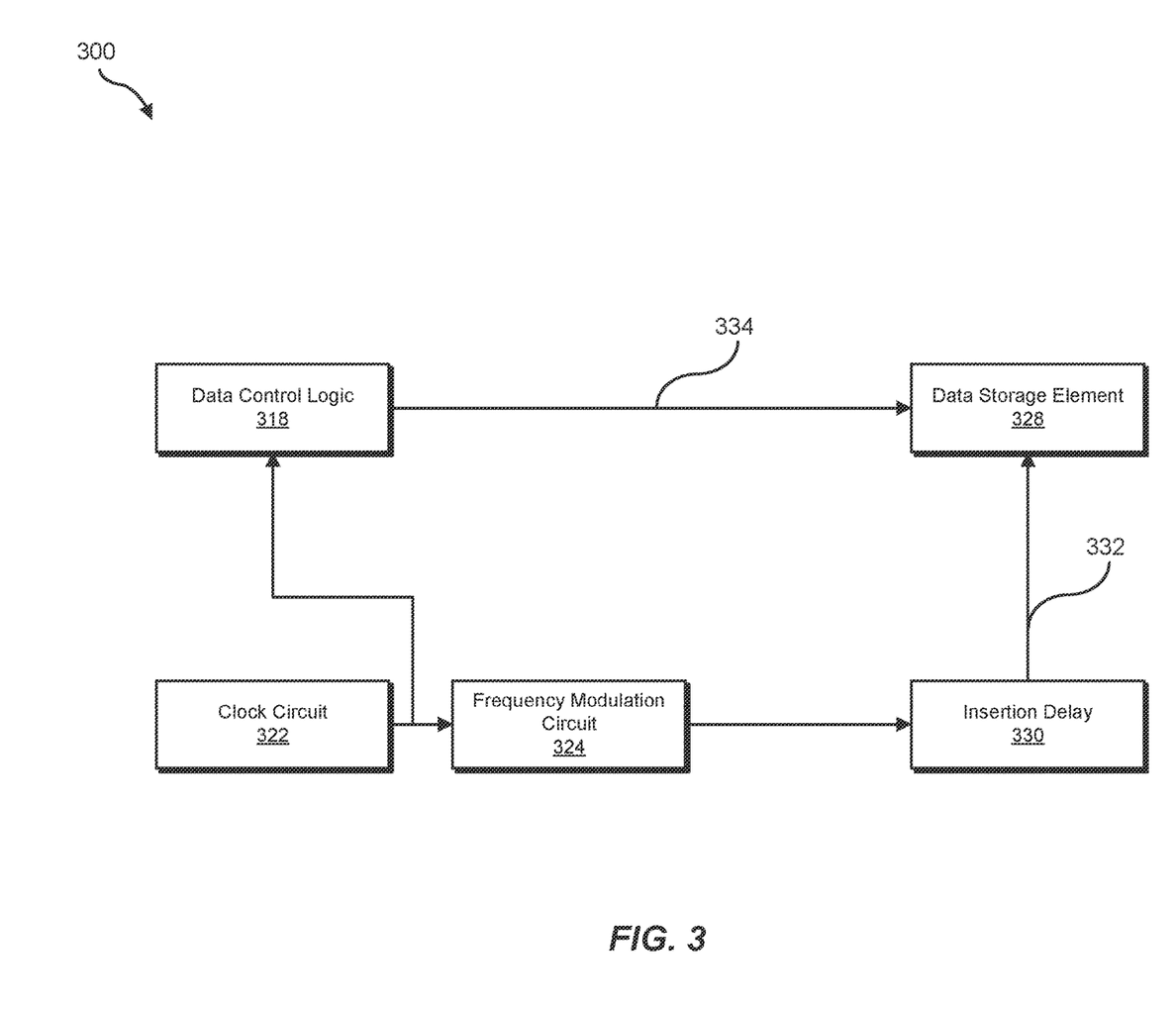
FIG. 3 is a block diagram of a clock forwarded asymmetric clocking system with clock frequency modulation.

FIG. 3 illustrates simplified signal paths of a system 300 which may correspond to system 100. System 300 is a clock forwarded asymmetric clocking system, such as a memory device, in which a clock signal timing is based on when a circuit receives the clock signal, and the clock signal can be delayed. System 300 includes a data control logic 318 which corresponds to data control logic 118, a data storage element 328 which corresponds to data storage element 128, a clock circuit 322 which corresponds to clock circuit 122, a frequency modulation circuit 324 which corresponds to frequency modulation circuit 124, and an insertion delay 330. Insertion delay 330 represents delay circuits and other delays of a clock signal along a clock path 332 (e.g., WCK in FIG. 2) from clock circuit 322 to data storage element 328. Data control logic 318 sends data along a data path 334

(e.g., DQ in FIG. 2) to data storage element 328. FIG. 3 illustrates signal paths for data control logic 318 sending data to data storage element 328, although in other examples other signal paths can be used.

Figure 4A:
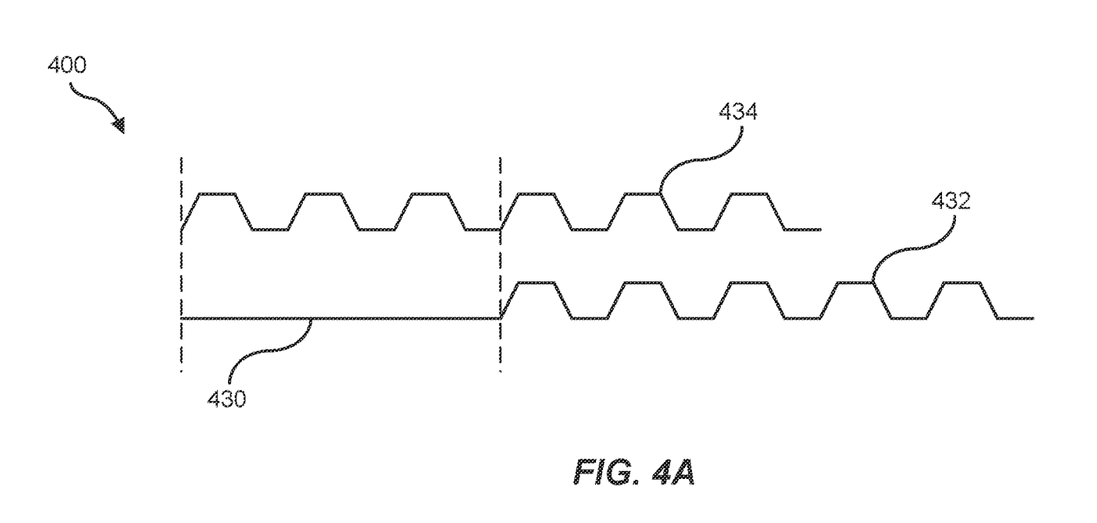
FIGS. 4A-4B are clock signal diagrams of frequency modulation.
Figure 4B:
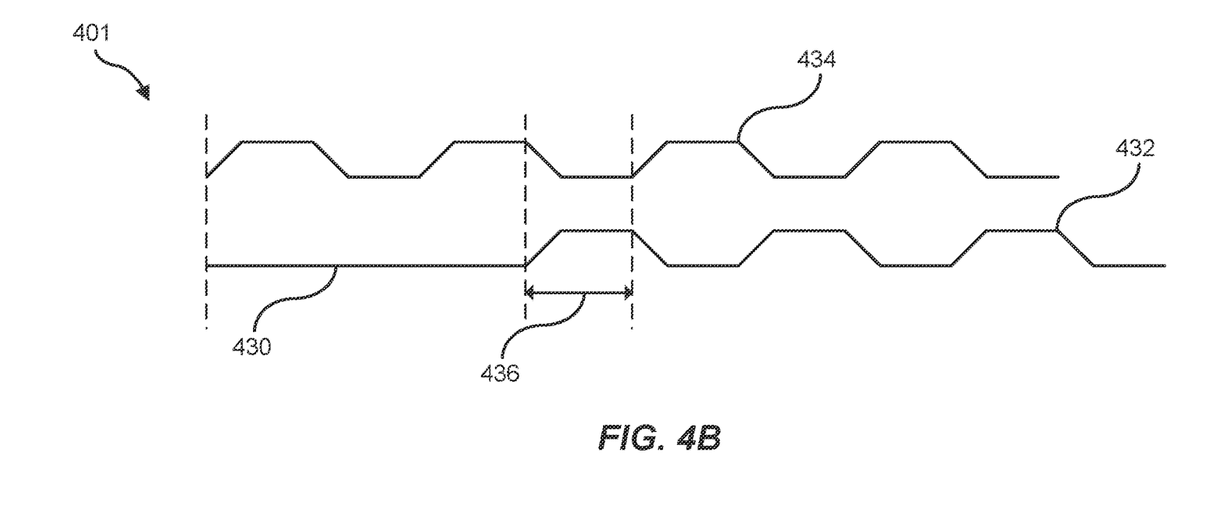

FIGS. 4A and 4B illustrate a phase error resulting from frequency modulation with reference to system 300. FIGS. 4A and 4B include a data signal 434 which corresponds to data path 334, a clock signal 432 which corresponds to clock path 332, and an insertion delay 430 which corresponds to insertion delay 330. To illustrate the phase error more clearly, data signal 434, as illustrated in FIGS. 4A and 4B, matches with clock signal 432, such that data signal 434 regularly oscillates from high to low similar to clock signal 432. In other examples the signals may not match.

FIG. 4A illustrates a signal graph 400 for signals received at data storage element 328. In FIG. 4A, the frequency of clock signal 432 is not modulated (e.g., 100% frequency or 0% modulation). As illustrated in FIG. 4A, insertion delay 430 delays clock signal 432 received at data storage element 328. However, the phase relationship between data signal 434 and clock signal 432 does not change such that the clock edges align (e.g., the rising edges align). In some examples, insertion delay 330 can be configured to maintain clock edge alignment at data storage element 328 (e.g., to achieve insertion delay 430).

FIG. 4B illustrates a signal graph 401 for signals received at data storage element 328. In FIG. 4B, the frequency of clock signal 432 is modulated by 0.5 (e.g., 50% frequency or 50% modulation). Although FIG. 4B illustrates 50% modulation to illustrate the phase error more clearly, in other examples, the frequency can be modulated with different values (e.g., from 1-3%). As illustrated in FIG. 4B, insertion delay 430 delays clock signal 432 received at data storage element 328. However, the clock edges of data signal 434 and clock signal 432 no longer align. The modulated frequency produces a phase error 436 between the clock edges. For instance, the rising edge of data signal 434 is offset from the rising edge of clock signal 432 by phase error 436. Phase error 436 represents noise or jitter introduced by frequency modulation. As the frequency modulation changes, phase error 436 also changes such that phase error 436 can depend on the value of frequency modulation.

Figure 5A:
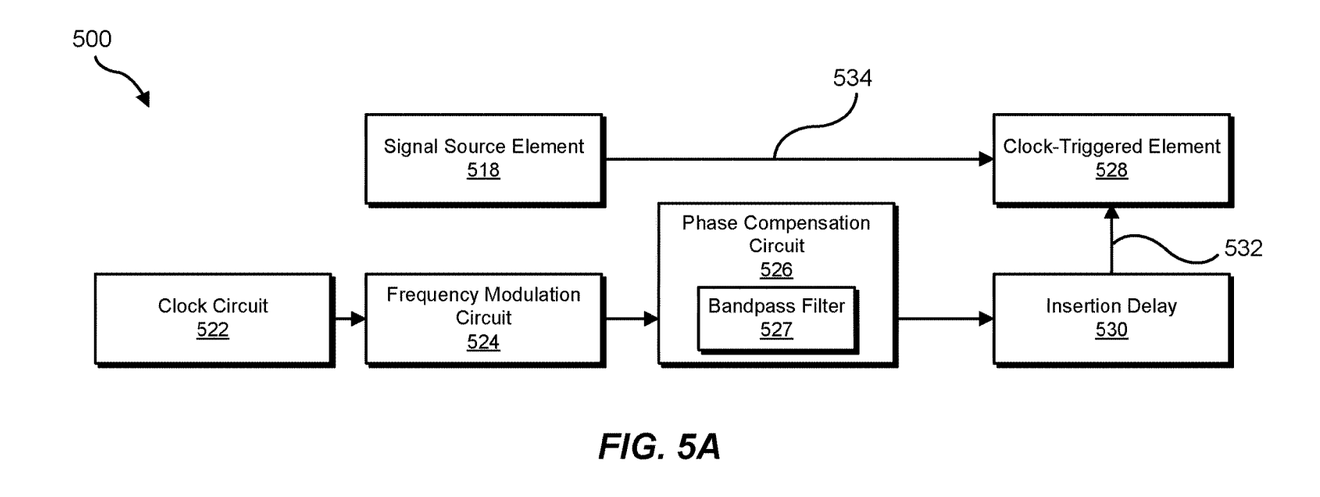
FIGS. 5A-5B are block diagrams of exemplary clock forwarded asymmetric clocking systems with clock frequency modulation and compensation.
Figure 5B:
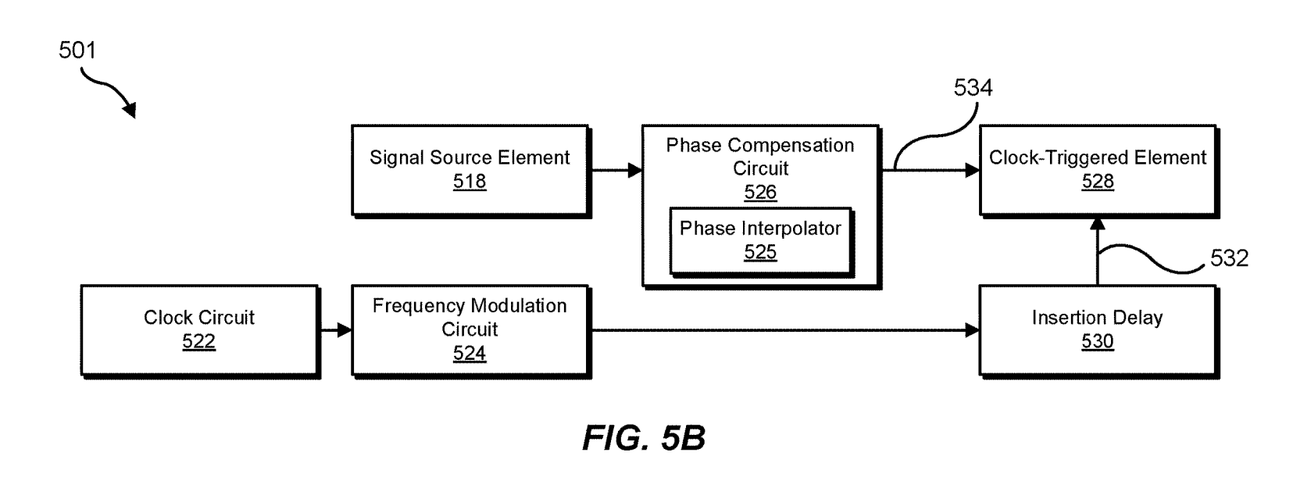

Turning to FIGS. 5A and 5B, FIG. 5A illustrates signal paths of a system 500 which may correspond to system 100. System 500 is a clock forwarded asymmetric clocking system, such as a memory device, that can compensate for phase errors due to frequency modulation. System 500 includes a signal control logic 518 which corresponds to data control logic 118 or any other input signal source and/or control logic, a clock-triggered element 528 which corresponds to data storage element 128 or any other circuit triggered by a clock signal, a clock circuit 522 which corresponds to clock circuit 122, a frequency modulation circuit 524 which corresponds to frequency modulation circuit 124, and an insertion delay 530. Insertion delay 530 represents delay circuits and other delays of a clock signal along a clock path 532 (e.g., WCK in FIG. 2) from clock circuit 522 to clock-triggered element 528. Signal control logic 518 sends a data or input signal along an input path 534 (e.g., DQ in FIG. 2) to clock-triggered element 528. FIG. 5A illustrates signal paths for signal control logic 518 sending data to clock-triggered element 528, although in other examples other signal paths can be used.

FIG. 5B illustrates signal paths of a system 501 which may correspond to system 100. Similar to system 500, system 501 is a clock forwarded asymmetric clocking system, such as a memory device, that can compensate for phase errors due to frequency modulation. System 501 includes signal control logic 518, clock-triggered element 528, clock circuit 522, frequency modulation circuit 524, and insertion delay 530. FIG. 5B illustrates signal paths for signal control logic 518 sending data to clock-triggered element 528, although in other examples other signal paths can be used.

FIG. 5A illustrates an implementation having phase compensation circuit 526 along clock path 532 whereas FIG. 5B illustrates an implementation having phase compensation circuit 526 along input path 534. Phase compensation circuit 526 can modify the clock signal to compensate for a phase error (e.g., phase error 436 in FIG. 4B) produced by modulating the frequency of the clock signal, as will be explained in reference to FIGS. 6A and 6B.

Figure 6A:
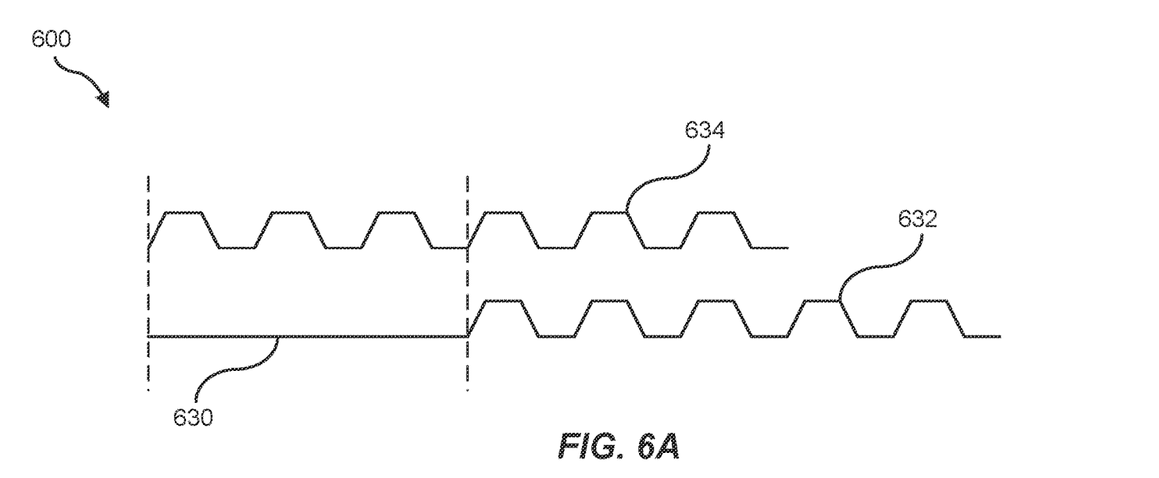
FIGS. 6A-6B are clock signal diagrams of frequency modulation with compensation.
Figure 6B:
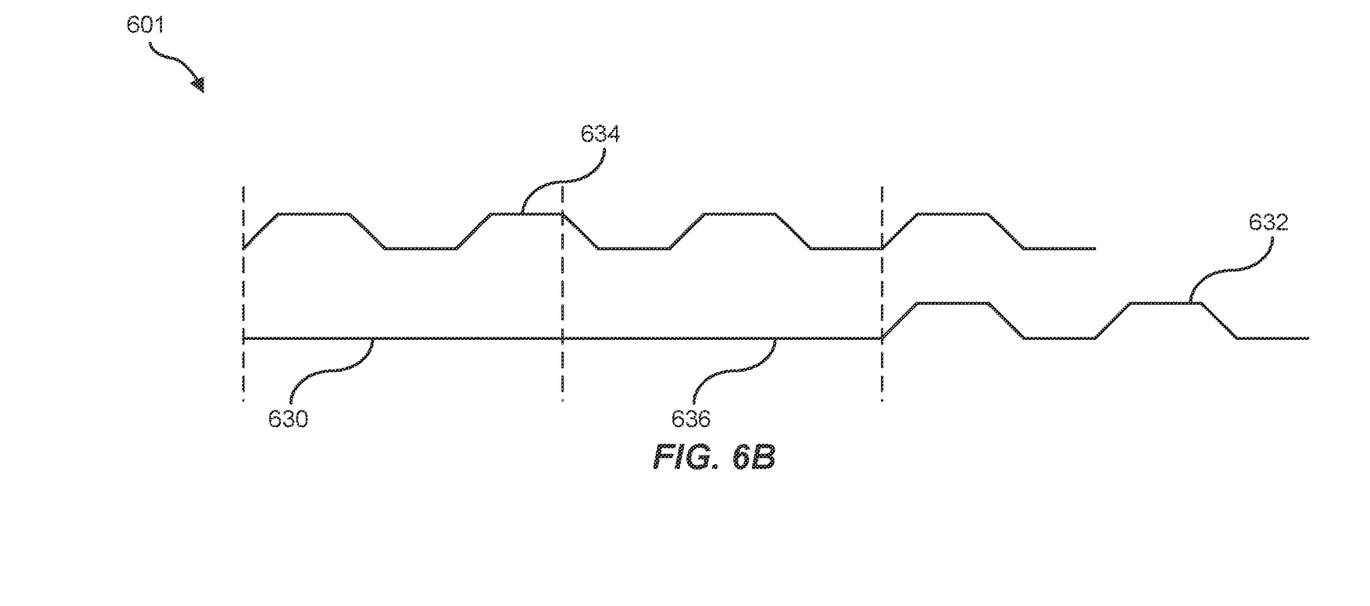

FIGS. 6A and 6B illustrate how a phase error resulting from frequency modulation can be compensated for or corrected. FIGS. 6A and 6B include an input signal 634 which corresponds to input path 534, a clock signal 632 which corresponds to clock path 532, and an insertion delay 630 which corresponds to insertion delay 530. To illustrate the phase compensation more clearly, input signal 634, as illustrated in FIGS. 6A and 6B, matches with clock signal 632, such that input signal 634 regularly oscillates from high to low similar to clock signal 632. In other examples the signals may not match.

FIG. 6A illustrates a signal graph 600 for signals received at clock-triggered element 528. In FIG. 6A, the frequency of clock signal 632 is not modulated (e.g., 100% frequency or 0% modulation). As illustrated in FIG. 6A, insertion delay 630 delays clock signal 632 received at clock-triggered element 628. The phase relationship between input signal 634 and clock signal 632 does not change such that the clock edges align. In some examples, insertion delay 530 can be configured to maintain clock edge alignment at clock-triggered element 528 (e.g., to achieve insertion delay 630).

FIG. 6B illustrates a signal graph 601 for signals received at clock-triggered element 528. In FIG. 6B, the frequency of clock signal 632 is modulated by 0.5 (e.g., 50% frequency or 50% modulation). Although FIG. 6B illustrates 50% modulation to illustrate the phase compensation more clearly, in other examples, the frequency can be modulated with different values (e.g., from 1-3%). As illustrated in FIG. 6B, insertion delay 630 delays clock signal 632 received at clock-triggered element 528. However, clock signal 632 further includes a phase compensation offset 636 inserted by phase compensation circuit 526. Thus, the clock edges of input signal 634 and clock signal 632 (e.g., rising edges) are aligned. Although the modulated frequency produces a phase error, phase compensation offset 636 can compensate for the phase error. Phase compensation circuit 526 can provide the appropriate phase compensation offset 636 as the frequency modulation value changes. In FIG. 6B, phase compensation offset 636 increases signal delay (e.g., effectively lengthening insertion delay 630). In other examples, phase compensation offset 636 can decrease the signal delay (e.g., effectively reducing insertion delay 630).

Returning to FIGS. 5A and 5B, phase compensation circuit 526 can be implemented with one or more circuits for delaying signals, such as a phase interpolator 525, a phase delay circuit, etc. In some implementations, phase compensation circuit 526 includes a bandpass filter 527 for filtering the modulated clock signal. In some implementations, phase compensation circuit 526 includes a feedback loop for modulating a magnitude and/or phase value of the clock signal.

In some implementations (e.g., in FIG. 5A), phase compensation circuit 526 receives input from frequency modulation circuit 524. For example, phase compensation circuit 526 can compensate for the phase error by inserting a phase compensation offset to the modulated clock signal based on a modulation value provided by frequency modulation circuit 524. Further, in some examples, phase compensation circuit 526 can incrementally adjust the phase compensation in real time based on the modulation value. For instance, as frequency modulation circuit 524 continuously modulates the frequency with changing modulation values, phase compensation circuit 526 can accordingly adjust the phase compensation.

The phase error, in some examples, relates to insertion delay 530. If the modulation value (mod) applied by frequency modulation circuit 524 is known, phase compensation circuit 526 can calculate the phase error with the following equation:

$$\text{Phase}_{error} = (100/100-\text{mod}-1)*\text{Delay}_{insertion} \quad \text{Equation 1}$$

In some implementations (e.g., in FIG. 5B), phase compensation circuit 526 can compensate for the phase error by inserting a phase compensation offset into the modulated clock signal based on inferring a modulation value for the frequency modulation. Phase compensation circuit 526 can infer the modulation value based on observing phase changes of the clock signal in the system. In some examples, phase compensation circuit 526 can observe the phase changes by comparing a return clock signal (e.g., RCK in FIG. 2) with the clock signal (e.g., WCK in FIG. 2). In some examples, phase compensation circuit 526 includes a comparator for comparing the return clock signal with the clock signal. In some examples, phase compensation circuit 526 can observe the phase changes by determining a delay delta beyond an expected phase delay (e.g., insertion delay 530) due to a temperature change. For instance, a temperature change in the system may produce a delay delta beyond insertion delay 530. By measuring the temperature change, phase compensation circuit 526 can further observe the phase changes to calculate the phase error and provide the appropriate phase compensation offset.

For example, phase compensation circuit 526 can calculate the phase error with the following equation:

$$\text{Phase}_{error} = \text{Delay}_{insertion}*(\text{Period}_{mod}-\text{Period}_{base}/\text{Period}_{base}) \quad \text{Equation 2}$$

$\text{Delay}_{insertion}$ corresponds to the insertion delay (e.g., insertion delay 630), $\text{Period}_{mod}$ corresponds to the period of the modulated clock signal (e.g., 1/(modulated frequency)), and $\text{Period}_{base}$ corresponds to the period of the base or unmodulated clock signal (e.g., 1/frequency). In some implementations, $\text{Period}_{mod}$ can be derived from observing phase changes in the clock signal, as described herein.

In other examples, phase compensation circuit 526 can calculate the phase error with the following equation:

$$\text{Phase}_{error} = \text{Phase}_{delta}*(\text{Delay}_{insertion}-\text{Delay}_{totalinsertion})-\text{Delay}_{tempdelta} \quad \text{Equation 3}$$

$\text{Phase}_{delta}$ corresponds to the phase change between the return clock signal and the clock signal, $\text{Delay}_{totalinsertion}$ corresponds to a total insertion delay, and $\text{Delay}_{tempdelta}$ corresponds to the delay delta due to temperature change.

In some implementations, phase compensation circuit 526 can apply phase compensation offset 636 that equals or otherwise matches with the phase error (e.g., phase error 436). In some implementations, phase compensation circuit 526 can apply a scale factor to the phase error to generate phase compensation offset 636.

Figure 7:
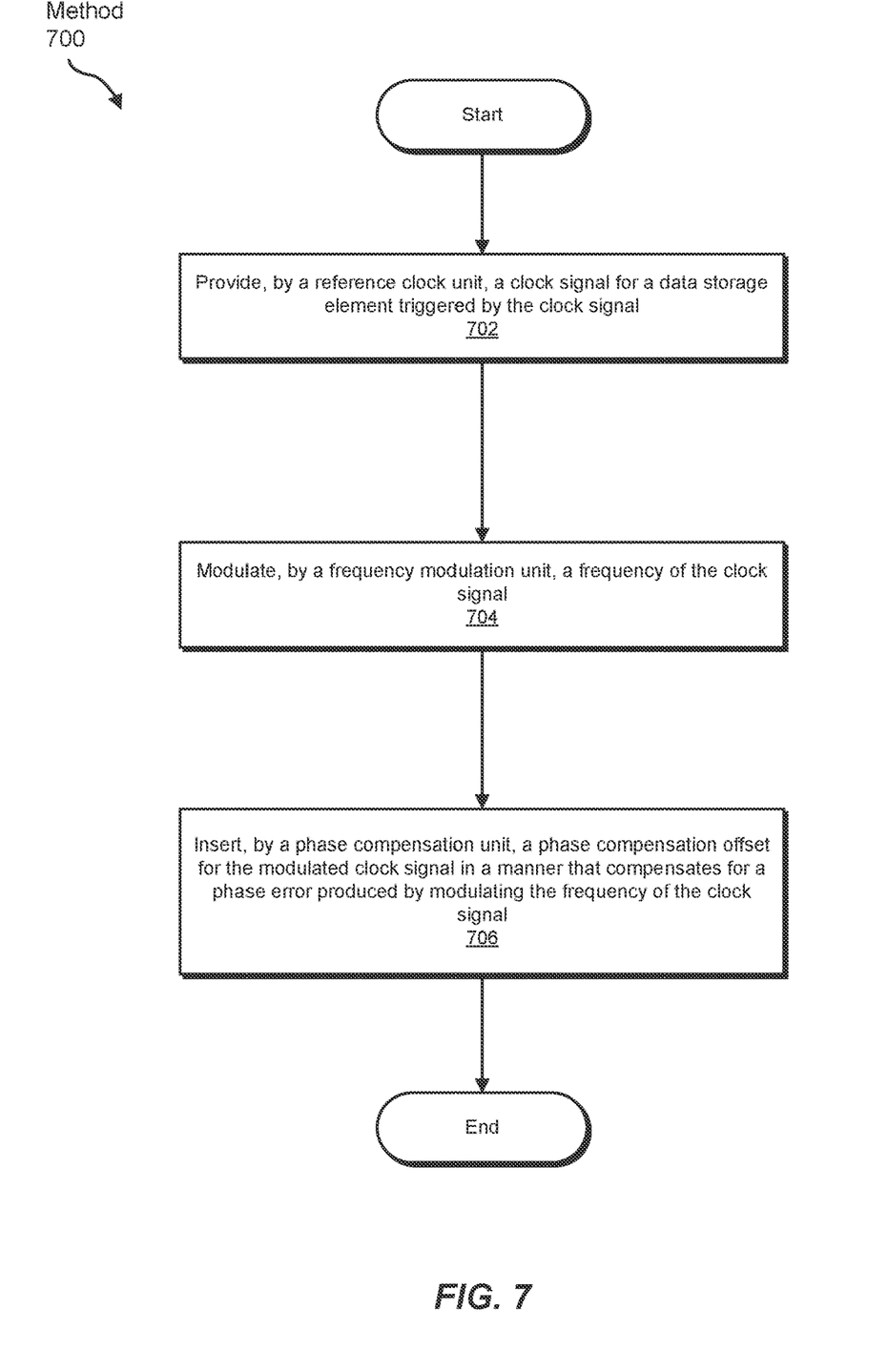
FIG. 7 is a flow diagram of an exemplary method for compensating for clock frequency modulation.

Turning now to FIG. 7, FIG. 7 is a flow diagram of an exemplary computer-implemented method 700 for compensation for clock frequency modulation. The steps shown in FIG. 7 can be performed by any suitable computer-executable code and/or computing system, including the system(s) illustrated in FIGS. 1, 2, 5A, and/or 5B. In one example, each of the steps shown in FIG. 7 can represent an algorithm whose structure includes and/or is represented by multiple sub-steps, examples of which will be provided in greater detail below.

As illustrated in FIG. 7, at step 702 one or more of the systems described herein provides, by a reference clock circuit, a clock signal for a clock-triggered element triggered by the clock signal. For example, clock circuit 122 provides a clock signal for data storage element 128.

The systems described herein can perform step 702 in a variety of ways. In one example, clock circuit 222 can provide a clock signal (e.g., CA, RCK, and/or WCK) to data storage element 228.

At step 704 one or more of the systems described herein modulates, by a frequency modulation circuit, a frequency of the clock signal. For example, frequency modulation circuit 124 modulates the clock frequency of clock circuit 122.

The systems described herein can perform step 704 in a variety of ways. In one example, frequency modulation circuit 124 can continuously modulate the clock frequency based on SSC or other frequency modulation techniques. Frequency modulation circuit 124 can vary the modulation value.

At step 706 one or more of the systems described herein inserts, by a phase compensation circuit, a phase compensation offset to the modulated clock signal in a manner that compensates for a phase error produced by modulating the frequency of the clock signal. For example, phase compensation circuit 126 inserts a phase compensation offset to the modulated clock signal to compensate for a phase error produced by modulating the clock frequency.

The systems described herein can perform step 706 in a variety of ways. In one example, phase compensation circuit 126 can insert the proper phase compensation offset based on an insertion delay between the clock and data paths and a modulation value applied by frequency modulation circuit 124 (which may be provided or inferred). Phase compensation circuit 126 can, in some examples, apply a scale factor to a phase error calculated from the insertion delay and modulation value to produce the phase compensation offset.

In some implementations, phase compensation circuit 126 can determine the phase compensation offset based on a modulation value provided by frequency modulation circuit 124. In some implementations, phase compensation circuit 126 can determine the phase compensation offset by inferring a modulation value for the frequency modulation. Phase compensation circuit 126 can infer the modulation value based on observing phase changes of the clock signal in system 100. For instance, observing the phase changes can include comparing a return clock signal with the clock signal or determining a delay delta beyond an expected phase delay due to a temperature change.

As described herein, SSC can be a useful technique for reducing EMI in computing systems, such as graphics systems, to improve performance and comply with EMI limits. In clock forwarded systems with asymmetric clock-to-data strobe paths, SSC can cause unwanted jitter. Adding SSC compensation or phase adjustment to data insertion delays can mitigate the unwanted jitter. As described herein, SSC compensation can be added to a fast path (e.g., data path) or a long path (e.g., clock path). The phase adjustment can be determined from the frequency modulation value as provided by an SSC circuit or inferred from observing phase changes in the clock signal.

As detailed above, the computing devices and systems described and/or illustrated herein broadly represent any type or form of computing device or system capable of executing computer-readable instructions, such as those contained within the modules/circuits described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SOCs), digital signal processors (DSPs), Neural Network Engines (NNEs), accelerators, graphics processing units (GPUs), portions of one or more of the same, variations or combinations of one or more of the same, or any other suitable physical processor.

Although illustrated as separate elements, the modules described and/or illustrated herein can represent portions of a single module or application. In addition, in certain implementations one or more of these modules can represent one or more software applications or programs that, when executed by a computing device, cause the computing device to perform one or more tasks. For example, one or more of the modules described and/or illustrated herein represent modules stored and configured to run on one or more of the computing devices or systems described and/or illustrated herein. In some implementations, a module can be implemented as a circuit or circuitry. One or more of these modules can also represent all or portions of one or more special-purpose computers configured to perform one or more tasks.

In addition, one or more of the modules described herein transforms data, physical devices, and/or representations of physical devices from one form to another. For example, one or more of the modules recited herein receives frequency modulation data to be transformed, transforms the frequency modulation data, and uses the result of the transformation to compensate for phase error. Additionally or alternatively, one or more of the modules recited herein can transform a processor, volatile memory, non-volatile memory, and/or any other portion of a physical computing device from one form to another by executing on the computing device, storing data on the computing device, and/or otherwise interacting with the computing device.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   providing, by a reference clock circuit, a clock signal for a clock-triggered element triggered by the clock signal;
   modulating, by a frequency modulation circuit, a frequency of the clock signal; and
   inserting, by a phase compensation circuit, a phase compensation offset to the modulated clock signal to compensate for a phase error produced by modulating the frequency of the clock signal, wherein the clock-triggered element is triggered by the modulated and phase compensated clock signal.

2. The method of claim 1, further comprising determining, by the phase compensation circuit, the phase compensation offset based on a modulation value provided by the frequency modulation circuit.

3. The method of claim 1, further comprising determining, by the phase compensation circuit, the phase compensation offset by inferring a modulation value for the frequency modulation.

4. The method of claim 3, wherein inferring the modulation value is based on observing phase changes of the clock signal.

5. The method of claim 4, wherein observing the phase changes includes at least one of comparing a return clock signal from the clock-triggered element with the clock signal or determining a delay delta beyond an expected phase delay due to a temperature change.

6. A system comprising:
- a reference clock circuit configured to produce a clock signal;
- a frequency modulation circuit coupled to the reference clock circuit and configured to modulate a frequency of the clock signal;
- a phase compensation circuit coupled to the reference clock circuit and configured to compensate for a phase error produced by modulating the frequency of the clock signal; and
- a latch circuit coupled to the reference clock circuit and triggered by the modulated and phase compensated clock signal.

7. The system of claim 6, wherein the phase compensation circuit compensates for the phase error by inserting a phase compensation offset to the modulated clock signal based on a modulation value provided by the frequency modulation circuit.

8. The system of claim 7, wherein the phase compensation circuit incrementally adjusts the phase compensation in real time based on the modulation value.

9. The system of claim 6, wherein the phase compensation circuit compensates for the phase error by inserting a phase compensation offset into the modulated clock signal based on inferring a modulation value for the frequency modulation.

10. The system of claim 9, wherein the phase compensation circuit infers the modulation value based on observing phase changes of the clock signal in the system.

11. The system of claim 10, wherein the phase compensation circuit observes the phase changes by comparing a return clock signal from the latch circuit with the clock signal.

12. The system of claim 11, wherein the phase compensation circuit comprises a comparator for comparing the return clock signal with the clock signal.

13. The system of claim 10, wherein the phase compensation circuit observes the phase changes by determining a delay delta beyond an expected phase delay due to a temperature change.

14. The system of claim 6, wherein the phase compensation circuit comprises a bandpass filter for filtering the modulated clock signal.

15. The system of claim 6, wherein the phase compensation circuit comprises a feedback loop for modulating a magnitude and phase value of the clock signal.

16. The system of claim 6, wherein the phase compensation circuit is coupled along an input path for the latch circuit.

17. The system of claim 6, wherein the phase compensation circuit is coupled along a clock path for the clock signal.

18. A memory device comprising:
- a reference clock circuit configured to produce a clock signal;
- a frequency modulation circuit coupled to the reference clock circuit and configured to modulate a frequency of the clock signal;
- a phase compensation circuit coupled to the frequency modulation circuit and configured to compensate for a phase error produced by modulating the frequency of the clock signal; and
- a data storage element coupled to the reference clock circuit and triggered by the modulated and phase compensated clock signal.

19. The memory device of claim 18, wherein the phase compensation circuit is coupled along a data path for the data storage element.

20. The memory device of claim 18, wherein the phase compensation circuit is coupled along a clock path for the clock signal.

* * * * *